United States Patent [19]
Fandrich

[11] Patent Number: 5,333,300
[45] Date of Patent: Jul. 26, 1994

[54] TIMING CIRCUITRY AND METHOD FOR CONTROLLING AUTOMATED PROGRAMMING AND ERASING OF A NON-VOLATILE SEMICONDUCTOR MEMORY

[75] Inventor: Mickey L. Fandrich, Placerville, Calif.

[73] Assignee: Intel Corporation, Santa Clara, Calif.

[21] Appl. No.: 654,385

[22] Filed: Feb. 11, 1991

[51] Int. Cl.⁵ .............................................. G06F 13/24
[52] U.S. Cl. .................... 395/550; 395/425; 364/940.81
[58] Field of Search ...................... 395/550, 325, 425; 364/940.81; 365/189.01, 189.03, 189.04, 189.05, 189.07, 218, 230.08, 900

[56] References Cited

U.S. PATENT DOCUMENTS

| | | | |
|---|---|---|---|
| 4,545,030 | 10/1985 | Kitchin | 364/900 |
| 4,835,728 | 5/1989 | Si et al. | 364/900 |
| 5,053,990 | 10/1991 | Krifels et al. | 395/425 |
| 5,070,443 | 12/1991 | Priem et al. | 395/725 |

Primary Examiner—Dale M. Shaw
Assistant Examiner—Moustafa M. Meky
Attorney, Agent, or Firm—Blakely, Sokoloff, Taylor & Zafman

[57] ABSTRACT

Circuitry for handshaking between a command state machine and write state machine is described. The handshaking circuitry, the command state machine and the write state machine are part of a non-volatile semiconductor memory device that includes a memory array. The command state machine receives commands from a user and communicates valid commands to the write state machine, which responds by performing automated program and erasure operations on the memory array, as appropriate. The command state machine identifies valid commands based upon signals generated by the handshaking circuitry. The handshaking circuitry includes three latches, an OR gate and a NAND gate. The serially coupled latches store an idle signal from the write state machine. The OR gate is coupled to outputs from the second and third of the serially coupled latches and generates a signal indicative of the whether the write state machine is idle. The NAND gate generates another signal indicative of whether the write state machine is busy based upon a start signal, a finished signal and a delayed idle signal. Also described are a method of handshaking between the write state machine and the command state machine and circuitry for powering up and powering down the write state machine.

23 Claims, 7 Drawing Sheets

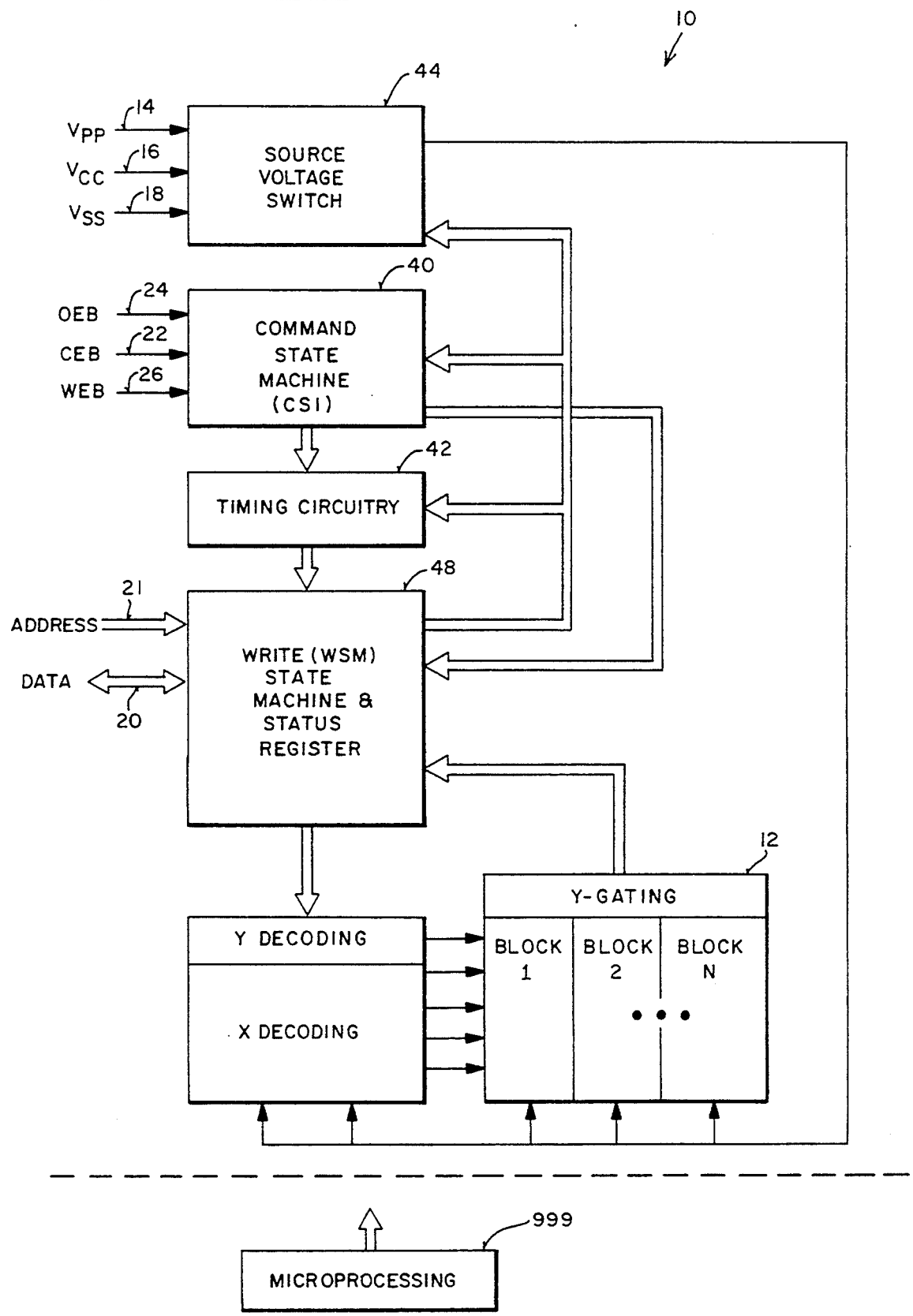

FIG._2

| COMMAND | BUS CYCLES REQ'D | FIRST BUS CYCLE | | | SECOND BUS CYCLE | | |
|---|---|---|---|---|---|---|---|
| | | OPERATION | ADDRESS | DATA | OPERATION | ADDRESS | DATA |
| READ ARRAY | 1 | WRITE | X | FFH | | | |
| READ STATUS REGISTER | 2 | WRITE | X | 70H | READ | X | SRD |
| CLEAR STATUS REGISTER | 1 | WRITE | X | 50H | | | |
| ERASE SETUP/ERASE CONFIRM | 2 | WRITE | BA | 20H | WRITE | BA | D0H |
| ERASE SUSPEND/ERASE RESUME | 2 | WRITE | BA | B0H | WRITE | BA | D0H |

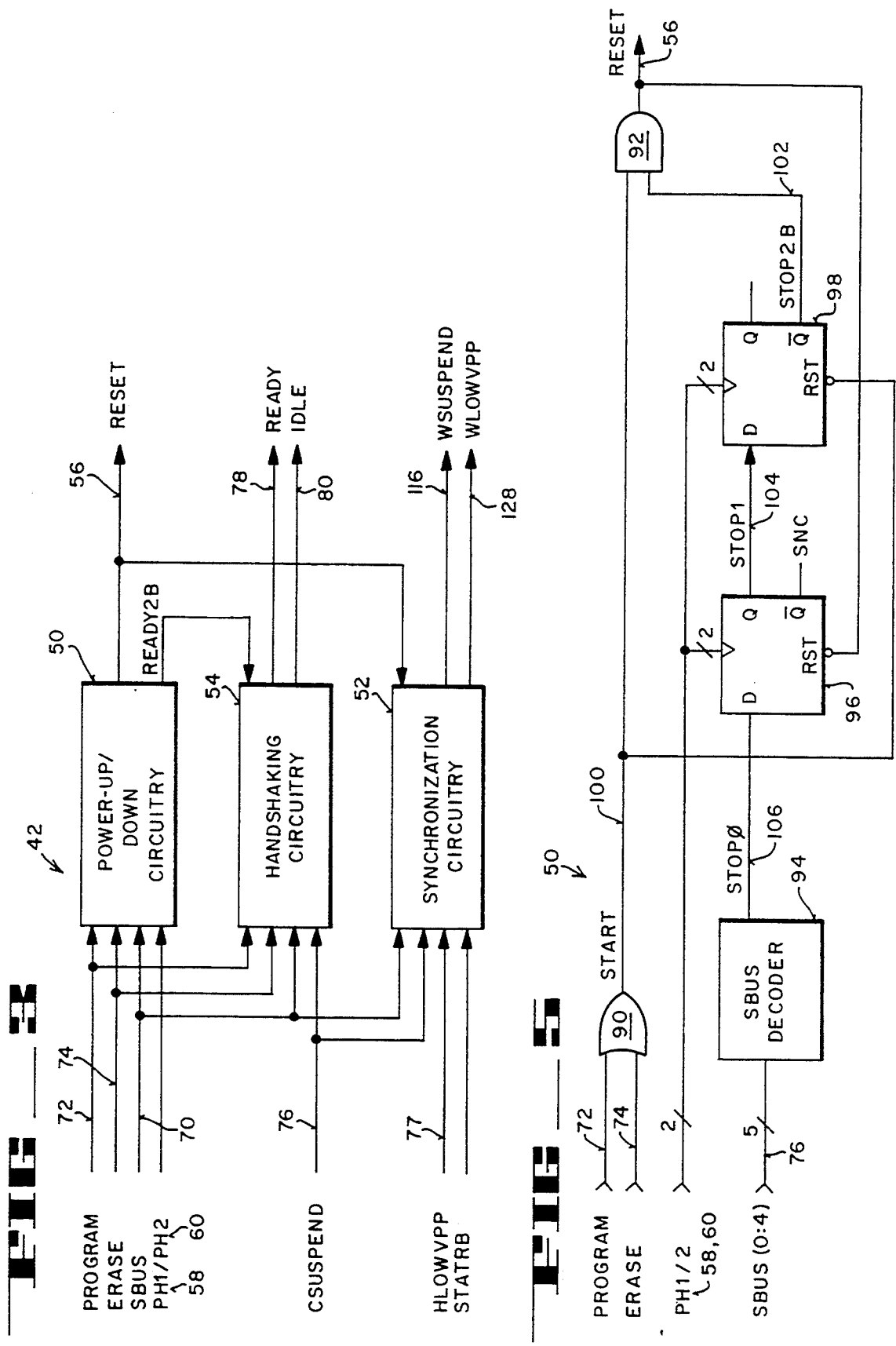

| IDLE | READY | WSM ACTIVITY | COMMANDS ALLOWED |
|---|---|---|---|
| 0 | 1 | WAITING FOR A COMMAND | ALL |
| 0 | 0 | ERASURE | SUSPEND, STATUS REGISTER READ |
| 1 | 1 | ERASE SUSPENDED | STATUS REGISTER READ, ARRAY READ, AND RESUME |

FIG_4

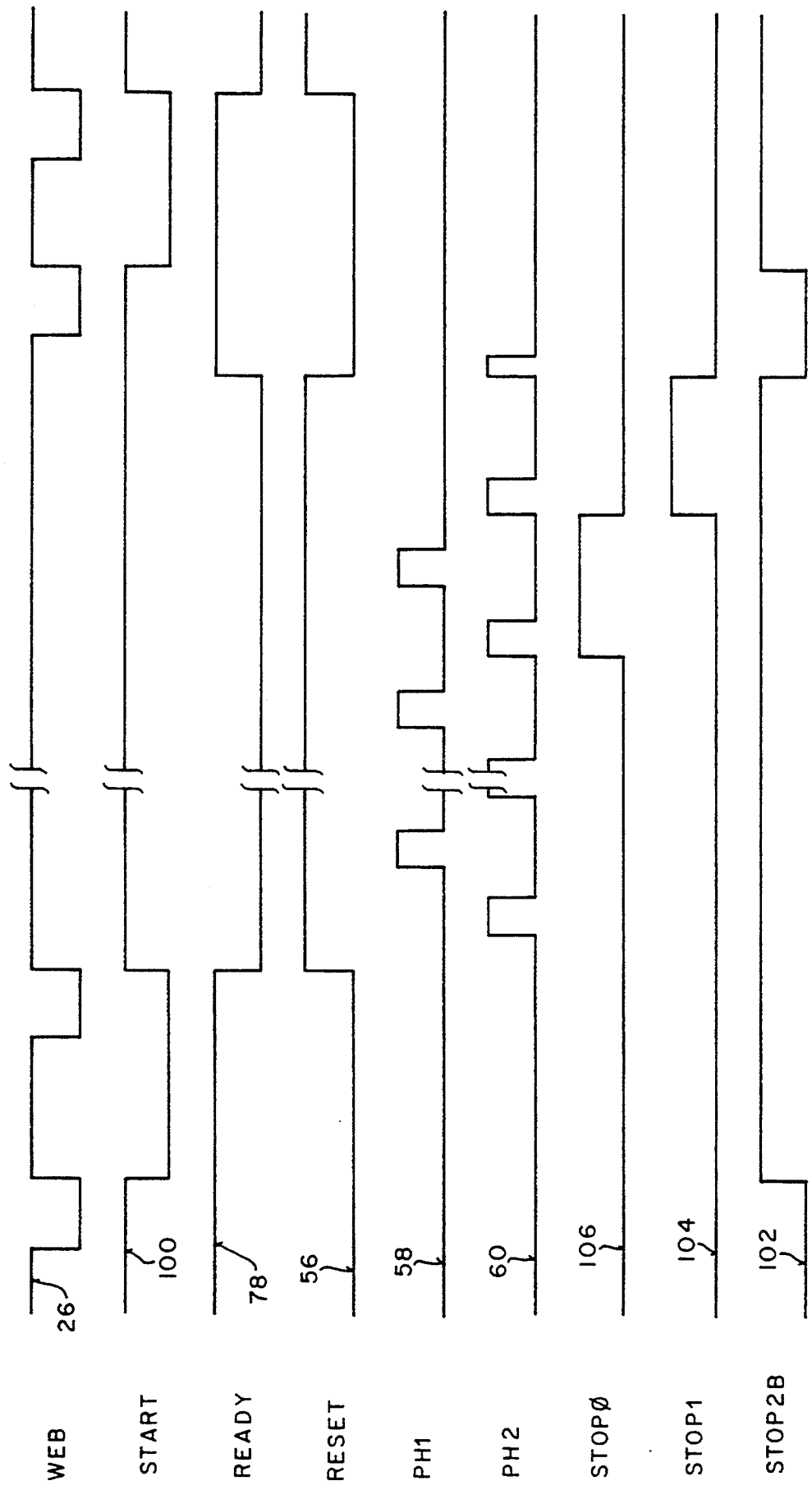

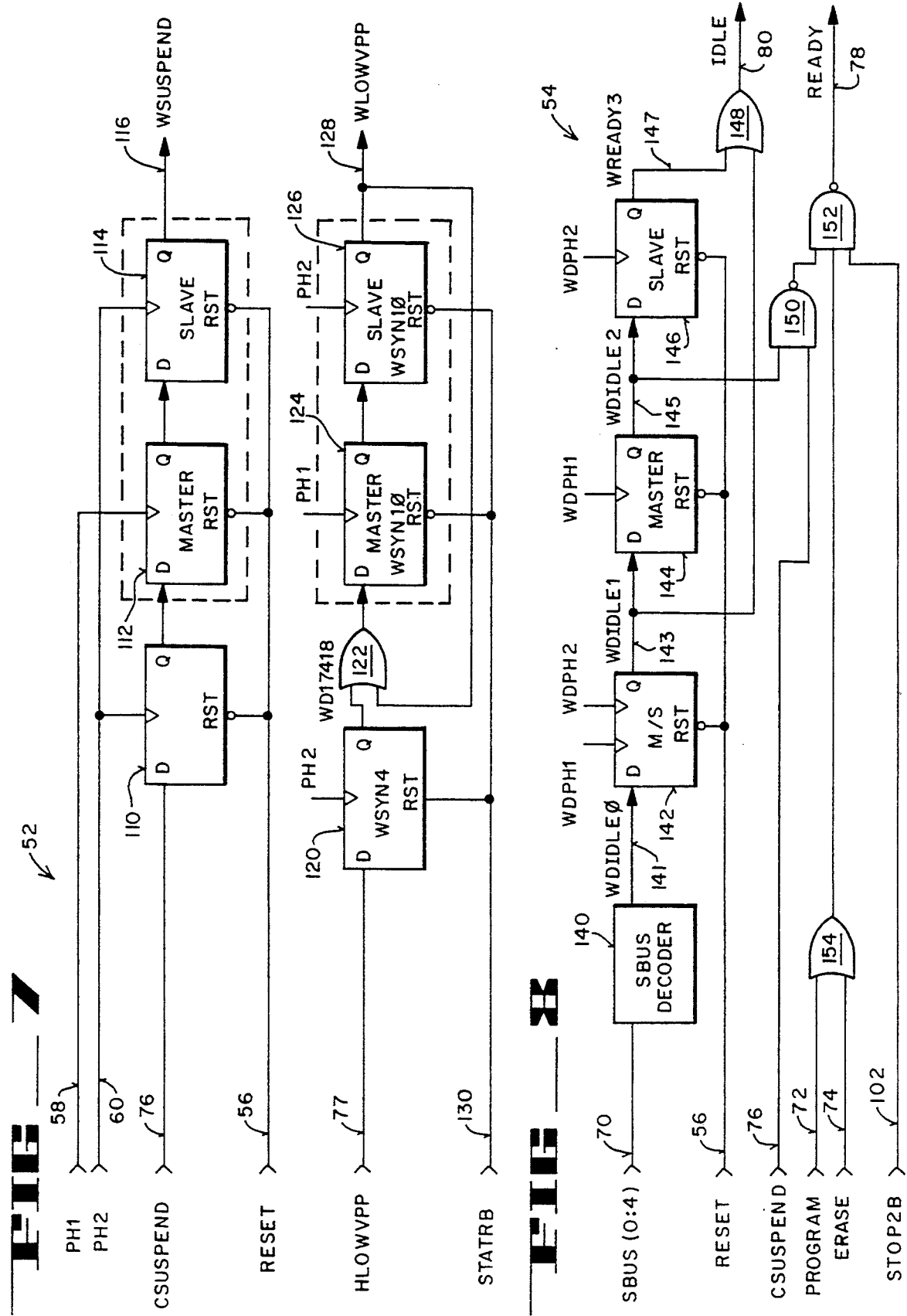

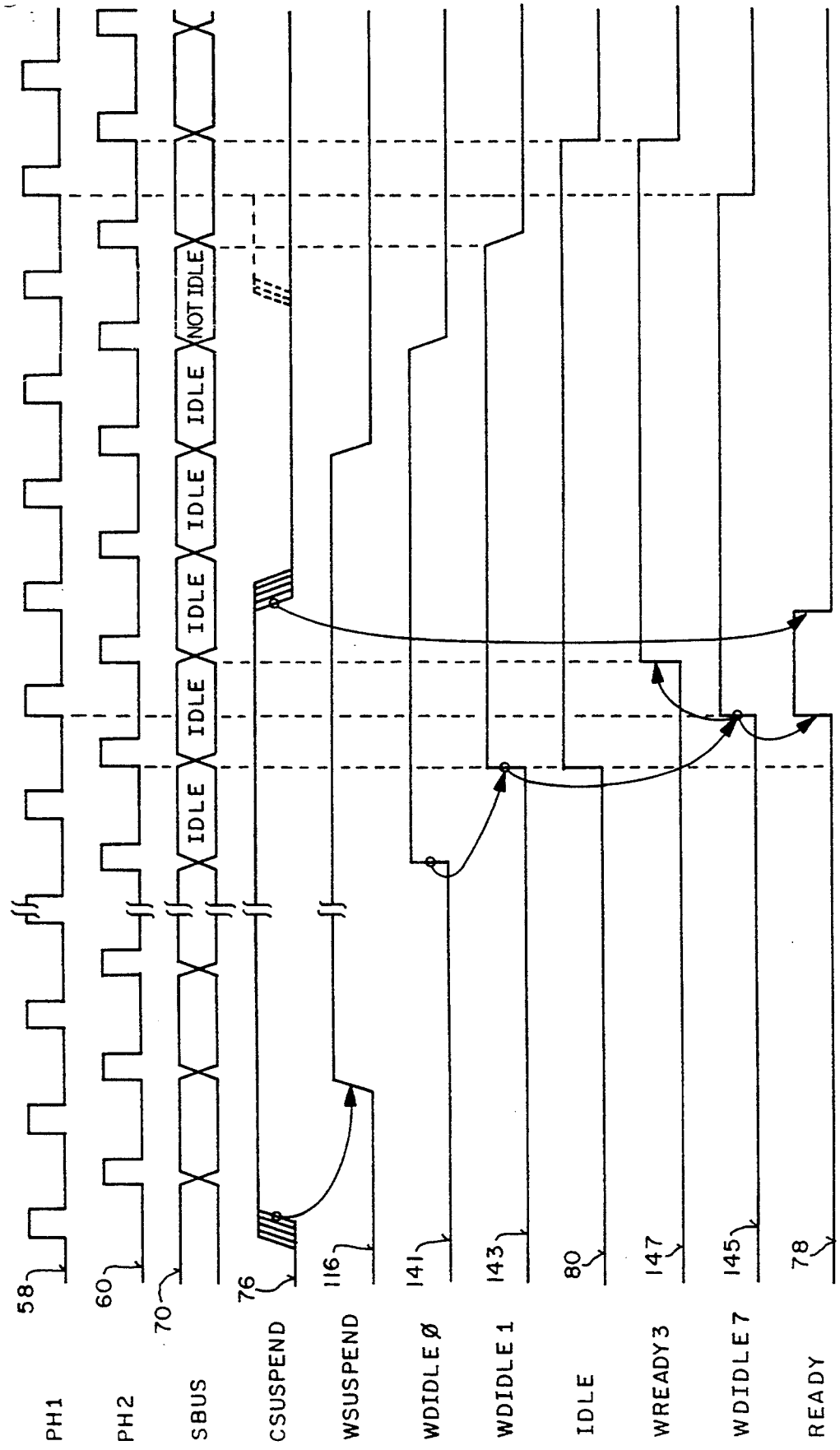

TIMING CIRCUITRY AND METHOD FOR CONTROLLING AUTOMATED PROGRAMMING AND ERASING OF A NON-VOLATILE SEMICONDUCTOR MEMORY

FIELD OF THE INVENTION

The present invention relates to the field of semiconductor memories. More particularly, the present invention pertains to timing circuitry for handshaking, powering up, and powering down write state circuitry, thereby controlling automated programming and erasure of a non-volatile semiconductor memory.

BACKGROUND OF THE INVENTION

One type of prior non-volatile semiconductor memory is the flash electrically erasable programmable read-only memory ("flash EEPROM"). The flash EEPROM can be programmed by a user, and once programmed, the flash EEPROM retains its data until erased. After erasure, the flash EEPROM may be programmed with new code or data.

Flash memories differ from conventional electrically erasable programmable read only memory ("EE-PROMs") with respect to erasure. Conventional EE-PROMS typically use a select transistor for individual byte erase control. Flash memories, on the other hand, typically achieve much higher density with single transistor cells. During one prior art erase modes for a flash memory, a high voltage is supplied to the sources of every memory cell in a memory array simultaneously. This results in a full array erasure.

For one prior flash EEPROM, a logical "one" means that few if any electrons are stored on a floating gate associated with a bit cell. A logical "zero" means that many electrons are stored on the floating gate associated with the bit cell. Erasure of that prior flash memory causes a logical one to be stored in each bit cell. Each single bit cell of that flash memory cannot be overwritten from a logical zero to a logical one without a prior erasure. Each single bit cell of that flash memory can, however, be overwritten from a logical one to a logical zero, given that this entails simply adding electrons to a floating gate that contains the intrinsic number of electrons associated with the erased state.

One prior flash EEPROM is the 28F256 complementary metal oxide semiconductor ("CMOS") flash memory sold by Intel Corporation, which is a 256 kilobit flash EEPROM. The 28F256 flash memory includes a common register to manage electrical erasure and reprogramming. Commands are written to the command register from a controlling microprocessor using standard microprocessor writing timings. The command register contents serve as input to an internal state machine that controls erase and programming circuitry.

The controlling microprocessor controls the erasure and programming of the flash memory. A prior Quick-Erase TM algorithm of Intel Corporation can be used by the microprocessor to erase the flash memory. The prior Quick-Erase TM algorithm requires that all bits first be programmed to their charged state, which is data equal to 00 (hexadecimal). Erasure then proceeds by pulling the sources of the transistors in the array up to the Vpp level for a period of 10 milliseconds. After each erase operation, byte verification is performed. The prior Quick-Erase TM algorithm allows up to 3000 erase operations prior to recognizing erasure failure. Proper device operation requires that the erasure procedure be strictly followed.

The prior Quick-Pulse Programming TM algorithm of Intel Corporation can be used by the microprocessor to then program the flash memory. The Quick-Pulse Programming TM algorithm requires that a programming pulse of a specific duration and voltage level be applied to the drain and gate of the selected transistors in the array. For example, for certain prior Intel flash memories a programming pulse of 10 microseconds has been suggested while Vpp is held at 12.75. After the programming pulse is applied, the user must verify whether the memory cell addressed is properly programmed. If not properly programmed, a programming pulse may be reapplied a number of times before a programming error is recognized. Intel's Quick-Pulse Programming TM algorithm allows up to 25 programming operations per byte. Proper and reliable operation of the flash memory mandates that the programming procedure be strictly followed.

One prior method of controlling the programming and erasure of flash memory requires rigid adherence to prevent overerasure. Overerasure typically is catastrophic to flash memories, as it typically results in the loss of the entire memory.

One prior method of controlling the programming and erasure of flash memory via a microprocessor requires a high degree of user sophistication to couple the microprocessor to the flash memory. Users of one prior method typically should be aware of the microprocessor's timing demands, as well as those of the flash memory. Users of the prior method typically should also monitor where in the programming or erase sequence the microprocessor is to prevent the possibility of issuing inappropriate commands to the memory at inappropriate points in a programming or erase sequence.

SUMMARY AND OBJECTS OF THE INVENTION

One of the objects of the present invention is to lockout certain commands, at appropriate times, that might otherwise disturb an automated program/erase sequence being performed on a non-volatile semiconductor memory.

Another of the objects of the present invention is to power down automated program and erasure circuitry within a non-volatile semiconductor memory at appropriate times to minimize power consumption within the non-volatile semiconductor memory Another of the objects of the present invention is to provide timing circuitry to force automated program and erasure circuitry of a non-volatile semiconductor memory to a predetermined state after the automated program and erasure circuitry finishes a program or erase operation Circuitry for handshaking between a command state machine and a write state machine is described. The handshaking circuitry, the command state machine and the write state machine are part of a non-volatile semiconductor memory device that includes a memory array. The command state machine receives commands from a user and communicates valid commands to the write state machine, which responds by performing automated program and erasure operations on the memory array, as appropriate. The command state machine identifies valid commands based upon signals generated by the handshaking circuitry. The handshaking circuitry includes three latches, an OR gate and a NAND gate. The serially coupled latches store an idle signal from the write state machine. The OR gate is coupled to outputs from the second and third of the serially coupled latches and generates a signal indicative of whether the write state machine is idle. The NAND gate generates another signal indicative of whether the write state machine is busy based upon a start signal, a finished signal and a delayed idle signal.

Circuitry for powering up and powering down the write state machine is also described. The circuitry includes a first latch to which a start signal is input. The output of the first latch is coupled to a second latch clocked by a clock signal. The clock signal is also coupled to the write state machine. An AND gate is coupled to both the output of the second latch and the start signal.

Also described is a method of handshaking between the command state machine and the write state machine. The method includes the steps of generating an active idle signal to indicate to the command state machine that the write state machine has paused during the execution of an erase operation, generating an active ready signal to indicate to the command state machine that it may communicate a first set of valid commands to the write state machine, the first set of valid commands not including an erase command, and generating an inactive ready signal to indicate to the command state machine that the write state machine is not ready to receive commands. The method further includes the step of generating an inactive idle signal to indicate to the command state machine that the write state machine has resumed execution of the paused erase operation.

Other objects, features, and advantages of the present invention will be apparent from the accompanying drawings and from the detailed description that follows below.

BRIEF DESCRIPTION OF DRAWINGS

The present invention is illustrated by way of example and not limitation in the figures of the accompanying drawings in which like references indicate similar elements and in which:

FIG. 1 is a block diagram of circuitry of a flash memory, including timing circuitry;

FIG. 2 is a table of device commands;

FIG. 3 is a block diagram of the command interface;

FIG. 4 is a table of valid commands;

FIG. 5 is a block diagram of the power up and power down circuitry;

FIG. 6 is a timing diagram for the power up and power down circuitry;

FIG. 7 is a block diagram of the timing circuitry;

FIG. 8 is a block diagram of the handshaking circuitry;

FIG. 9 is a timing diagram for a suspend command.

DETAILED DESCRIPTION

FIG. 1 illustrates in block diagram form the circuitry of flash EEPROM 10. Flash EEPROM 10 is also referred to as flash memory 10. Flash memory 10 includes a blocked memory array 12, which includes memory cells that store data at addresses.

In a preferred embodiment, the circuitry of flash memory 10 shown in FIG. 1 is on a single substrate. In a preferred embodiment, flash memory 10 employs ("CMOS") circuitry.

As described in more detail below, flash memory 10 includes timing circuitry 42. Timing circuitry 42 provides signals that allow the command state machine 40 to lock out inappropriate commands from the microprocessor 999. These signals are generated in response to the status of the write state machine 48. Thus, microprocessor 999 is prevented from interrupting the programming or erasure of the write state machine until the write state machine 48 has completed the operation in progress. Timing circuitry 42 also cleanly powers up a clock associated with the write state machine 48 and powers down the write state machine and its clock automatically upon completion of programming or erasure.

Vpp 14 is the erase/program power supply voltage for the flash memory 10. Vcc 16 is the device power supply for flash memory 10 and Vss 18 is ground. In one embodiment, Vpp 14 is 12.0 volts and Vcc 16 is approximately 5 volts.

In the absence of high voltage on Vpp 14 flash memory 10 acts as a read-only memory. The data stored at the addressed location is read from memory array 12 and made available via data lines 20 to the circuitry external to the flash memory 10.

Flash memory 10 has three control functions: chip-enable bar ("CEB"), write-enable bar ("WEB"), and output-enable bar ("OEB"). CEB input 22 is used to select flash memory 10. CEB 22 is active low. OEB 24 is the output control for flash memory 10 and should be used to gate data from the data pins 20 from flash memory 10. OEB 24 is active low. Both control functions CEB 22 and OEB 24 must be logically active to obtain data at the data lines 20 of flash memory.

Write enable bar signal WEB 26 allows writes to memory array 12 while CEB 22 is low. Write enable bar signal 26 is active low.

The microprocessor 999 controlling flash memory 10 writes to flash memory by bringing WEB 26 to a logic low level while CEB 22 is low. Addresses and data are latched on the rising edge of WEB 26. Standard microprocessor timings are used.

Device operations are selected by writing specific data patterns via the data input/output lines 20. FIG. 2 defines certain commands.

SRD in FIG. 2 represents data read from the status register. BA in FIG. 2 represents address within the block being erased.

Erase is executed one block at a time, initiated by a two-cycle command sequence. An Erase Setup command is first written to the command state machine, followed by the Erase Confirm command. The microprocessor 999 can detect the completion of the erase event by issuing a Read Status command and analyzing the status data.

In one embodiment, the erase command takes approximately one second per memory block or array. The Erase Suspend command allows erase sequence interruption in order to read data from a block other than the one being erased. Once the erase sequence is started, writing the Erase Suspend command ("BOH") to the data lines requests that the write state machine ("WSM") 48 suspend the erase sequence at predetermined points in the sequence. Polling the WSM BUSY and ERASE_SUSPEND status register bits determine when the erase operation has been suspended.

At this point, a Read Array command can be written to the data lines 20 to read data from blocks other than the block that is suspended.

Another valid command at this time is Erase Resume ("DOH"), which causes the WSM to resume erasure. In response to the Erase Resume, the ERASE_SUSPEND bit of the status register is cleared, and the BUSY bit is set once again.

Programming is also executed by a two-command sequence. Polling the status register with the Read Status Register command determines when the programming sequence is complete. Only the Read Status Register command is valid while programming is active.

In addition to memory array 12, flash memory includes on-chip command state machine ("CSM") 40, timing circuitry 42, source voltage switch 44, sense amps 46 and status register and write state machine ("WSM") 48.

The data on the data lines 20 is provides to the command state machine 40. The CSM 40 decodes the input data and, if it represents a command, begins generating the appropriate controls for the write state machine 48.

The program and erase algorithms for data array 22 are regulated by the write state machine 48. The write state machine 48 latches in the necessary address and data from inputs 20 and 21 needed to complete erase, suspend, and resume operations. The write state machine 48 reports its progress during function execution to command timing circuitry 42 via its SBUS outputs.

As can be seen in FIG. 3, the timing circuitry 42 includes power up/power down circuitry 50, synchronization circuitry 52, and handshaking circuitry 54.

Timing circuitry 42 controls two key functions. First, the timing circuitry 42 powers up the write state machine 48 whenever the command state machine 40 issues a program or erase command. Upon completion of programming and erase sequences, timing circuitry 42 cleanly powers down the write state machine 48. Second, timing circuitry 42 performs the necessary handshaking between the WSM 48 and the CSM 40 to lock out additional program or erase commands from the microprocessor while the WSM is executing a program, erase, or suspend request.

The status register reports the status of the write state machine 48 operations via its outputs, which are available to the microprocessor 999 on the DATA pins 20.

The power up/power down circuitry 50 powers up the write state machine 48 whenever the command state machine 40 initiates a program or erase operation. The power up/power down circuitry 50 also automatically powers down the write state machine (WSM) 48 when the WSM 48 indicates that it has completed the requested operation. The automatic powering down of the write state machine 48 helps to reduce the total power consumption of flash memory 10 because the WSM 48 runs only while it is executing a program or erase operation. The automatic powering down of the WSM 48 cleanly shuts down the WSM oscillator, preventing the WSM 48 from entering into unknown or undesired states.

The powering up and powering down of the WSM 48 is accomplished via the RESET signal 56. When the RESET signal 56 transitions from a logic 0 to a logic 1 the WSM oscillator starts up in a known state and after a short delay, the WSM phase clocks become active thus powering up the WSM 48. Similarly, when the RESET signal 56 transitions from a logic 1 to a logic 0 the WSM phase clocks PH1 58 and PH2 60 stop, powering down the WSM 48.

The synchronization circuitry 52 synchronizes informational signals generated outside the WSM 48 to the phase clocks PH1/PH2 58 and 60 of WSM 48.

Handshaking circuitry 54 determines the valid device commands from the microprocessor 999. Handshaking circuitry 54 thus helps to prevent the command state machine 40 from initiating another program or erase operation while WSM 48 is still performing a program or erase operation. This is of particular concern when the WSM 48 is resuming erasure after suspending operations.

Handshaking circuitry 54 determines the valid microprocessor 999 commands based upon the write state machine's current status, as represented by the SBUS signal 70 and the most recent commands from the microprocessor 9999, as indicated by the signals PROGRAM 72, ERASE 74, and SUSPEND 76.

The handshaking circuitry 54 informs the command state machine 40 of the valid commands via the READY signal 78 and the IDLE signal 80. The READY signal 78 indicates to CSM 40 and status register whether the write state machine 48 is busy or not. READY 78 is a logic 1 when the write state machine 48 is not busy, and is a logic 0 when WSM 48 is busy. The IDLE signal indicates to the CSM 40 whether WSM 48 has suspended its erase sequence. The IDLE signal 80 is a logic 1 when the WSM 48 has suspended erasure and is a logic 0 otherwise.

FIG. 4 lists the commands that are valid for each READY 78 and IDLE 80 state.

Circuitry 50 that controls the powering up and powering down of the write state machine 48 is illustrated in FIG. 5. The power up and power down circuitry 50 includes an OR gate 90, an AND gate 92, a SBUS decoder 94, and two cascaded D flip-flops 96 and 98.

The operation of the power up and power down circuitry 50 can be understood with reference to the timing diagram of FIG. 6. Powering up the WSM 48 begins with the initiation of a write sequence by the microprocessor 999.

Microprocessor 999 brings WEB 26 to a logic 0 and then pulls WEB 26 back to a logic 1. In response to the first rising edge of WEB 26 the command state machine 40 forces both the PROGRAM 72 and ERASE 74 signals to a logic zero. Thus, the output of the OR gate 90, START 100, will be forced to a logic 0.

The START signal 100 is applied to the reset pin RST of master-slave D flip-flop 98. Thus, when the START signal 100 goes to a logic 0, the flip-flop 98 resets, forcing the signal WDREADY2B 102 to a logic 1.

Both the WDREADY2B 102 and the START 100 signals are applied as inputs to the AND gate 92. Because the START signal 100 is a logic 0, the AND gate output, RESET 56, remains at an inactive logic 0.

The RESET signal 56 is applied to the reset pin RST of master-slave flip-flop 96. When RESET 56 is inactive, the flip-flop Q output 104 is a logic 0.

The microprocessor 999 next brings WEB 26 to a logic 0 and back to a logic 1 to complete the program or erase command. On the second WEB rising edge, command state machine 40 brings either the PROGRAM 72 or the ERASE 74 signal to an active logic 1, as appropriate. CSM 40 will keep the PROGRAM signal 72 or ERASE signal 74 active.

The START signal 100 is forced to a logic 1 when either the PROGRAM 72 or the ERASE 74 goes to an active logic 1. Thus, START 100 remains active until microprocessor initiates another program or erase operation. This action removes the reset signal from flip-flop 98, but WDREADY2B 102 remains a logic 1. Thus, the rising edge of the START signal 100 forces the RESET 56 signal to an active logic high.

Receipt of an active RESET signal 56 starts the oscillator within the write state machine 48, and shortly thereafter phase clocks PH1 58 and PH2 60 become active.

RESET 56 remains at a logic 0 even after the phase clocks 58 and 60 become active because the signals STOP1 104 and STOP2 102 are prevented from changing state by the SBUS decoder 94.

The SBUS decoder 94 analyzes the status signals SBUS[0:4] 70 from the write state machine 48 and determines when the RESET signal 56 should go inactive to shut the WSM 48 off. Until write state machine 48 indicates that it should be shut-off the SBUS decoder output, STOP0 106, is held at a logic 0. This action prevents STOP1 104 and STOP2B 102 from changing state and keeps RESET 56 at an active logic level.

When write state machine 48 completes the requested function, program or erase, the SBUS signals 70 cause the SBUS decoder 94 to bring STOP0 106 to a logic 1. STOP1 104 goes to a logic 1 on the first PH2 60 rising edge after STOP0 106 goes active high. Similarly, STOP2B 102 goes to a logic 0 on the first PH2 60 rising edge after STOP1 104 changes state.

The RESET signal 56 changes from a logic 1 to a logic 0 as soon as STOP2B 102 changes logic level. The oscillator within write state machine 48 stops and the phase clocks PH1 58 and PH2 60 halt bringing WSM operations to a halt. As a result the PH2 clock 60 on which STOP2B 102 transitions is of short duration as compared to typical PH2 clocks 60. The flip-flop 98 must be capable of latching on a short clock or RESET 56 will oscillate and the write state machine 48 will not shut-off cleanly.

In FIG. 5, it can be seen that the synchronization circuitry 52 includes two sets of cascaded D flip-flops 110, 112, 114, 120, 124 and 126 and an OR gate 122.

The synchronization circuitry 52 takes both the suspend signal CSUSPEND 76 from the command state machine 40 and the HLOWVPP signal 77 and synchronizes them with the write state machine phase clocks PH1 58 and PH2 60. The timing circuitry 42 circuitry 52 outputs to the WSM 48 the two WSM synchronized signals, WSUSPEND 116 and WLOWVPP 128.

The signal CSUSPEND 76 indicates that the write state machine 48 should suspend erasure by going to an active logic high. CSUSPEND 76 remains at a logic high for the entire period of time the write state machine 48 is to suspend block erasure. CSUSPEND 76 transitions back to a logic 0 when the WSM 48 is to resume erasure.

The WSUSPEND 116 signal is generated by applying CSUSPEND 76 to a set of three cascaded D-flip-flops 110, 112 and 114. Synchronization of CSUSPEND 76 is accomplished by clocking the flip-flops 110, 112 and 114 using the WSM phase clocks PH1 58 and PH2 60.

The WSUSPEND 110 signal is reset before the beginning of an erase sequence by the RESET signal 56, which is applied to the reset pin of D flip-flops 110, 112 and 114. WSUSPEND 116 is free to follow CSUSPEND 76 after RESET 56 transitions to its active high state at the beginning of the erase sequence.

The HLOWVPP signal 77 is generated by high voltage detection circuitry within the flash memory. The high voltage circuitry constantly monitors the program voltage Vpp 10 and indicates to WSM 48 when Vpp 14 falls below minimum programming levels because low Vpp 14 may effect WSM 48 operations. HLOWVPP 77 is set to a logic 1 when a low programming voltage is detected.

The WLOWVPP 128 signal is generated by applying HLOWVPP 77 to a set of three cascaded D-flip-flops 120, 124 and 126. Synchronization is accomplished by clocking the flip-flops 120, 124, and 126 using the WSM phase clocks PH1 and PH2.

The WLOWVPP signals 128 is reset from the status register reset bar signal WSTATRB 130. The WSTATRB signal 130 is generated in response to a CLEAR STATUS REGISTER command from the microprocessor 999.

When STATRB 130 is deasserted, WLOWVPP 128 is free to follow HLOWVPP 77 when it transitions from a logic 0 to a logic 1. The action of the OR gate 122 prevents WLOWVPP 28 following HLOWVPP 77 when it transitions from a logic 1 back to a logic 0. Thus, WLOWVPP 128 indicates a low programming voltage until flip-flops 120, 124 and 126 are reset by STATRB 130.

The handshaking circuitry 54 includes a SBUS decoder 140; three cascaded D flip-flops 142, 144 and 146; an OR gate 148; two NAND gates 150 and 152; and an OR gate 154.

The operation of handshaking circuitry 54 can be understood by beginning discussion with a time immediately proceeding the initiation of an erase command and continuing discussion through the events initiated by the sequence of commands: Erase, Erase Suspend and Erase.

It will be understood with reference to FIG. 4 that between the time that WSM completes a program or erase sequence and another sequence is initiated the handshaking circuitry 54 tells the CSM 40 that all device commands are valid.

The READY signal 78 is generated by the three input NAND gate 152. As discussed above, the signal STOP2B 102 goes to a logic 0 when the WSM 48 is powered down. This forces the READY signal 78 to a logic 1, and indicates that the WSM 48 is ready to perform another task.

The signals WDIDLE1 143 and WREADY3 147 are ORed together by OR gate 148 to generate the IDLE signal 180. While the WSM 48 is powered down, the RESET 56 signal is a logic 0, which forces WDIDLE1 143, WDIDLE2 145, and WREADY3 147 to a logic 0. Thus, it can be seen that while RESET 56 is a logic 0, the IDLE signal will also be a logic 0.

Assume now that the microprocessor 999 requests a block erase. CSM 40 responds to the request of microprocessor 999 by bringing the ERASE signal 74 to a logic 1. This forces the START signal to a logic high and places a logic 1 on one of the inputs to NAND gate 152.

Also as a result of the CSM 40 bringing ERASE 74 to an active level the WREADY2B signal 102 goes to a logic 1, as discussed above. This inputs a second logic 1 to the NAND gate 152.

The third input to NAND gate 152 is generated by the NAND gate 150. The inputs to gate 150 are CSUSPEND 76 and WDIDLE1 143. CSUSPEND 76 is held at a logic 0 until the microprocessor requests that the erasure be suspended. Thus, until the erasure sequence is suspended the NAND gate's 150 output will be a logic 1.

Given that the NAND gate's 152 three inputs are all logic ones when the CSM 40 initiates an erasure sequence, the READY signal 78 will be a logic 0. The READY 78 signal thus indicates that the WSM 48 is busy in response to the active ERASE signal 74.

When CSM 40 brings the ERASE signal 74 active the RESET signal 56 transitions from a logic 0 to a logic 1. This change in RESET 56 allows the flip-flop Q outputs, WDIDLE1 143, WDIDLE2 145 and WREADY3 147, to follow WDIDLE0 141.

The WIDLE0 signal 141 is forced to a logic 0 when the WSM 48 is first powered up by RESET 56 going to an active logic 1. As a result, while the flip-flop Q outputs 143, 145 and 147 are free to change value, they do not change value immediately after RESET 56 becomes active. Thus, the IDLE signal 180 remains a logic 0 when CSM 40 first initiates a program or erase sequence.

Once erasure begins the ready signal is a logic 0, as is the idle signal. Thus, as stated in FIG. 4, only the suspend status read and status register clear commands will be responded to by flash memory 10. Any other command, such as a program or erase command will be ignored by the command state machine 40.

Sometime during the block erase sequence the microprocessor 999 may choose to read data from a block of memory. To do so the microprocessor 999 first suspends the erasure sequence by writing an Erase Suspend command via the data lines 20. In response, the CSM 40 brings CSUSPEND 76 to a logic 1; however, neither the READY signal 78 nor the IDLE signal 80 will change state, until after the WSM 48 indicates via SBUS[0:4] 70 that it has entered its idle state.

Referring to the timing diagram of FIG. 9, it can be seen that the WSM 48 forces WDIDLE0 140 to a logic 1 sometime after it receives the signal WSUSPEND 116. The IDLE signal 80 rises to a logic 1 as soon as WDIDLE0 141 ripples through the flip-flops to WDIDLE1 143.

The READY signal 78 transitions to a logic 1 when WDIDLE2 145 changes to a logic 1. This is due to the action of NAND gates 150 and 152 in concert. The READY signal 78 cannot transition until the output of NAND gate 150 changes because the signals PROGRAM 72, ERASE 77, and READY2B 102 are all unchanged by the suspend sequence. When WDIDLE2 145 goes to a logic high, the NAND gate 150 output will transition to a logic 0 and READY 78 will go to a logic 1.

The signals READY 78 and IDLE 80 now indicate that flash memory's contents can be read.

When the microprocessor 999 has read the data, it issues an Erase Resume command via the data lines 20. In response, the CSM 40 deasserts the CUSUSPEND signal 76, indicating that the WSM 48 should resume erasure.

The READY signal 78 follows to a CSUSPEND signal 76 when it transitions to a logic 0, indicating immediately that the WSM 48 is busy.

In contrast, the IDLE signal 80 does not change state until the falling edge of WREADY3 147 due to the action of OR gate 148. Because the IDLE signal 80 cannot transition from the suspend state before READY signal 78 does so, handshaking circuitry 54 prevents the CSM 40 from allowing the initiation of another program or erase sequence before the WSM 48 completes the erase sequence that was suspended.

An important feature of the IDLE signal is that it surrounds the READY signal; i.e., the IDLE signal rises to a logic high before the READY signal and the IDLE signal falls to a logic low after the READY signal. This feature of the IDLE signal prevents the microprocessor 999 from being able to read false data from the status register. In other words, the microprocessor 999 will never be informed incorrectly that the write state machine is ready to begin a new program or erase operation when in fact the write state machine is the process of resuming a suspended and incomplete erase operation.

In summary, timing circuitry for controlling the automatic programming and erasing of a non-volatile semiconductor memory has been described. The timing circuitry provides appropriately timed lock outs of certain commands from an external processor that might otherwise disturb an automated program/erase sequence of a non-volatile semiconductor memory. The timing circuitry also automatically powers down the write state machine upon completion of program and erase sequences thereby helping to reduce the power consumption of the non-volatile semiconductor memory.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. Handshaking circuitry in a memory device including a command state machine, a write state machine, and a memory array, the command state machine receiving commands from a user, the command state machine communicating valid commands to the write state machine, the command state machine identifying valid commands in response to the handshaking circuitry, the write state machine performing operations on the memory array in response to valid commands from the command state machine, the write state machine indicating its status to the handshaking circuitry, the write state machine performing an erase operation in response to an erase command from the command state machine, the handshaking circuitry comprising:
   (a) a first latch for storing an idle signal from the write state machine;
   (b) a second latch coupled to the first latch;
   (c) a third latch coupled to the second latch;
   (d) an OR gate coupled to the first latch and the third latch, the OR gate outputting a signal indicating whether the write state machine is idle;
   (e) a NAND gate coupled to a start signal, a finished signal and a delayed idle signal, the NAND gate outputting a busy signal for indicating whether the write state machine is busy.

2. The circuitry for handshaking of claim 1, further comprising a NAND gate coupled to the second latch and a suspend signal from the command state machine for generating the delayed idle signal.

3. The circuitry for handshaking of claim 1 further comprising, an OR gate coupled to a program signal and an erase signal for generating the start signal.

4. Circuitry for controlling timing of signals between a write state machine and a command state machine in a memory device including the command state machine, the write state machine, and a memory array, the command state machine receiving commands from a user, the command state machine communicating valid commands to the write state machine, the command state machine identifying valid commands in response to a handshaking circuitry, the write state machine performing operations on the memory array in response to valid commands from the command state machine, the write state machine indicating its status to the handshaking circuitry, the write state machine performing an erase operation in response to an erase command from the command state machine, the write state machine pausing performance of the erase operation in response to a suspend command from the command state machine, the circuitry for controlling the timing of signals between the write state machine and the command state machine comprising:
 (a) powering up and powering down circuitry for automatically powering up and powering down a clock associated with the write state machine, the clock generating a clock signal; and
 (b) handshaking circuitry coupled to the write state machine and the command state machine.

5. The circuitry of claim 4, further comprising a means for synchronizing a suspend command from command state machine to clock signals from the clock.

6. The circuitry of claim 4 wherein the means for automatically powering up and powering down a clock comprises:
 (a) means for starting the clock in response to a start signal;
 (b) a latch for stopping the clock in response to a stop signal, wherein the latch is clocked by the clock.

7. Circuitry for stopping a write state machine in a memory device including a command state machine, the write state machine, and a memory array, the command state machine receiving commands from a user, the command state machine communicating valid commands to the write state machine, the command state machine identifying valid commands in response to a handshaking circuitry, the write state machine performing operations on the memory array in response to valid commands from the command state machine, the write state machine indicating its status to the handshaking circuitry, the circuitry for stopping the write state machine comprising:
 (a) circuitry for powering up a clock, the clock outputting a clock signal, the clock signal being coupled to the write state machine; and
 (b) a latch for powering down the clock in response to a stop signal, wherein the latch is clocked by the clock signal.

8. The circuit of claim 7 further comprising means for decoding status signals to generate the stop signal.

9. Circuitry for powering up and powering down a write state machine in a memory device including a command state machine, the write state machine, and a memory array, the command state machine receiving commands from a user, the command state machine communicating valid commands to the write state machine, the command state machine identifying valid commands in response to a handshaking circuitry, the write state machine performing operations on the memory array in response to valid commands from the command state machine, the write state machine indicating its status to the handshaking circuitry, the circuitry for powering up and powering down the write state machine comprising:
 (a) a first latch for storing a stop signal;
 (b) a second latch coupled to the first latch wherein the second latch is clocked by a clock coupled to the write state machine; and
 (c) an AND gate coupled to the second latch and a start signal.

10. The circuitry of claim 9, further comprising a decoder generating the stop signal from status signals.

11. The circuitry of claim 9, further comprising an OR gate for generating the start signal, wherein the OR gate is coupled to an erase signal and a program signal.

12. The circuitry of claim 9, wherein the AND gate is coupled to the first latch.

13. Handshaking circuitry in a memory device including a command state machine, a write state machine, and a memory array, the command state machine receiving commands from a user, the command state machine communicating valid commands to the write state machine, the command state machine identifying valid commands in response to the handshaking circuitry, the write state machine performing operations on the memory array in response to valid commands from the command state machine, the write state machine indicating its status to the handshaking circuitry, the write state machine performing an erase operation in response to an erase command from the command state machine, the command state machine being able to issue a first set of commands while the write state machine is erasing, the write state machine pausing performance of the erase operation in response to a suspend command from the command state machine, the command state machine being able to issue a second set of commands while the write state machine is paused, the second set of commands not including the erase command, the handshaking circuitry comprising:
 (a) idle signal generator generating an active idle signal in response to an active first signal from the write state machine, the active first signal indicating that the write state machine has paused an operation, the idle signal going active at a first time in response to the first signal being active, the idle signal being coupled to the command state machine; and
 (b) ready signal generator generating an inactive ready signal in response to an active erase signal, the ready signal being coupled to the command state machine, the ready signal indicating that the write state machine is busy performing an operation on the memory array when the ready signal is inactive, the ready signal being driven active in response to an active suspend signal at a second time after the first time, the second set of commands being enabled at the second time, the ready signal being driven inactive in response to the suspend signal going inactive while the erase signal remains active at a third time after the second time and before a fourth time when the idle signal is driven inactive in response to the suspend signal going inactive, indicating that the erase operation has resumed in response to a resume command, the first set of commands being enabled at the fourth time.

14. The circuitry for handshaking of claim 13, the ready signal generator further comprising:
 circuitry coupled to the erase signal and the suspend signal, the circuitry driving the ready signal inactive whenever the erase signal is active and the suspend signal is inactive, indicating that the write machine is busy performing an operation on the memory array, the circuitry driving the ready signal active whenever the suspend signal is active, indicating that the write machine has suspended the operation on the memory array and may perform a new operation on the memory array.

15. The circuitry for handshaking of claim 14, wherein commands that can be issued by the command state machine while the write state machine is performing an erase operation include SUSPEND and STATUS REGISTER READ.

16. The circuitry for handshaking of claim 15, wherein the commands that can be issued when the write state machine has suspended an erase operation include STATUS REGISTER READ, ARRAY READ, and RESUME.

17. A method for handshaking in a memory device including a command state machine, a write state machine, and a memory array, the command state machine receiving commands from a user, the command state machine communicating valid commands to the write state machine, the command state machine identifying valid commands in response to the handshaking circuitry, a write state machine performing operations on the memory array in response to valid commands from the command state machine, the write state machine indicating its status to the handshaking circuitry, the write state machine performing an erase operation in response to an erase command from the command state machine, the command state machine being able to issue a first set of valid commands while the write state machine is erasing, the write state machine pausing performance of the erase operation in response to a suspend command from the command state machine, the command state machine being able to issue a second set of commands while the write state machine is paused, the second set of commands not including the erase command, the method for handshaking comprising the sequential steps of:
  (a) indicating that the write state machine has paused an erase operation via an active idle signal;
  (b) indicating that the write state machine is ready to receive a valid command via an active ready signal, the command state machine being enabled to issue the second set of commands but not being enabled to issue a second erase command;
  (c) indicating that the write state machine is not ready to receive a command via an inactive ready signal in response to a command from the command state machine to resume the erase operation; and
  (d) indicating via an inactive idle signal that the write state machine is no longer in the idle state in response to the write state machine resuming the erase operation.

18. The method for handshaking of claim 17, wherein the first set of commands includes SUSPEND and STATUS REGISTER READ.

19. The method for handshaking of claim 18, wherein the second set of commands includes STATUS REGISTER READ, ARRAY READ, and RESUME.

20. A method for controlling timing of signals between a write state machine and a command state machine in a memory device including the command state machine, the write state machine, and a memory array, the command state machine receiving commands from a user, the command state machine communicating valid commands to the write state machine, the command state machine identifying valid commands in response to the handshaking circuitry, a write state machine performing operations on the memory array in response to valid commands from the command state machine, the write state machine indicating its status to the handshaking circuitry, the write state machine performing an erase operation in response to an erase command from the command state machine, the command state machine being able to issue a first set of valid commands while the write state machine is erasing, the write state machine pausing performance of the erase operation in response to a suspend command from the command state machine, the command state machine being able to issue a second set of commands while the write state machine is paused, the second set of commands not including the erase command, the method for controlling the timing of signals between the write state machine and the command state machine comprising the sequential steps of:
  (a) powering up a clock outputting a clock signal in response to the erase command from the command state machine, the clock signal being coupled the write state machine;
  (b) indicating via an inactive ready signal that the write state machine is not ready in response to the write machine starting the erase operation;
  (c) indicating that the write state machine has paused an erase operation via an active idle signal;
  (d) indicating that the write state machine is ready to receive a valid command via an active ready signal, the command state machine being enabled to issue the second set of commands but not being enabled to issue a second erase command;
  (e) indicating that the write state machine is not ready to receive a command via an inactive ready signal in response to a command from the command state machine to resume the erase operation;
  (f) indicating via an inactive idle signal that the write state machine is no longer in the idle state in response to the write state machine resuming the erase operation; and
  (g) powering down the clock substantially near a rising edge of the clock signal in response to a stop signal.

21. The method of claim 20, wherein the first set of commands includes SUSPEND and STATUS REGISTER READ.

22. The method of claim 21, wherein the second set of commands includes STATUS REGISTER READ, ARRAY READ, and RESUME.

23. The method of claim 22 further comprising the steps of:
  (a) storing a SUSPEND command from the command state machine;
  (b) providing the SUSPEND command to the write state machine substantially near the rising edge of the clock signal.

* * * * *